(12) United States Patent
Smith et al.

(10) Patent No.: US 7,690,828 B2
(45) Date of Patent: Apr. 6, 2010

(54) ILLUMINATION DEVICE

(75) Inventors: Lyndon Smith, Shipley (GB); Colin Fuller, Shipley (GB)

(73) Assignee: Pace PLC, Shipley (GB)

( * ) Notice: Subject to any disclaimer, the term of this patent is extended or adjusted under 35 U.S.C. 154(b) by 0 days.

(21) Appl. No.: 12/214,426

(22) Filed: Jun. 19, 2008

(65) Prior Publication Data

US 2008/0316753 A1  Dec. 25, 2008

(30) Foreign Application Priority Data

Jun. 20, 2007 (GB) ................... 0711899.5

(51) Int. Cl.
 *F21V 33/00* (2006.01)
(52) U.S. Cl. .............. 362/558; 362/559; 362/555; 362/26; 200/314
(58) Field of Classification Search .......... 362/26, 362/27, 551, 555, 231, 558, 559, 806; 200/314; 385/31, 32, 39
See application file for complete search history.

(56) References Cited

U.S. PATENT DOCUMENTS

| 5,747,756 | A | | 5/1998 | Boedecker | |
|---|---|---|---|---|---|
| 5,826,708 | A | * | 10/1998 | Finlay | 200/314 |
| 6,428,216 | B1 | * | 8/2002 | Savage, Jr. | 385/88 |
| 6,918,677 | B2 | * | 7/2005 | Shipman | 362/26 |
| 7,352,930 | B2 | * | 4/2008 | Lowles | 385/31 |
| 2004/0240193 | A1 | | 12/2004 | Mertz | |

FOREIGN PATENT DOCUMENTS

| EP | 1720048 A1 | 8/2006 |
|---|---|---|
| JP | 11-231797 | 8/1999 |
| WO | WO 97/33417 | 9/1997 |

\* cited by examiner

*Primary Examiner*—Thomas M Sember
(74) *Attorney, Agent, or Firm*—Head, Johnson & Kachigian

(57) ABSTRACT

An illumination device comprising an LED (14) mounted on a rear of a PCB (12), and a light pipe (16) to direct light from the LED through an aperture (18) in the PCB to illuminate a legend (10) on the front of the PCB, the light pipe diffusing the light so as to prevent uneven illumination of the legend.

11 Claims, 1 Drawing Sheet

ILLUMINATION DEVICE

CROSS REFERENCE TO RELATED APPLICATION

This application claims priority to British Patent Application No. 0711899.5 filed 20 Jun. 2007.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

The invention to which this application relates is illumination means for articles where space is restricted, for example, but not necessarily limited to, in connection with touch-sensitive display panels.

Touch-sensitive applications are often used in connection with display panels and require a printed circuit board (PCB) to be mounted directly on the inside of a plastic fascia in order to allow the creation of touch-sensitive areas or buttons on the outside of the panel fascia. However, it can be problematic if these touch-sensitive buttons also require backlighting.

For example, Light Emitting Diodes (LEDs) cannot be mounted on the topside of the board, as the board is already touching the plastic, and there is not enough room for the LED between the PCB and fascia. A reverse through hole LED behind a hole in the PCB cannot be used, as the legs of the through hole LED would come through the board and foul the fascia plastic.

It is possible to drill a hole in the center of the button and use a reverse SMT LED to shine through the hole, but larger LEDS are needed to span the hole and such LEDs are costly due to their size. In addition, because the LED is close to the fascia, the light tends not to be distributed evenly; and there may be bright spots as the light from the LEDs is not diffused enough. These disadvantages are accentuated for larger regions were multiple LEDs are necessary, and the variations in light intensity become more apparent.

An aim of the present invention is to provide illumination for one or more regions of a touch-sensitive display panel which overcomes the above problems.

BRIEF SUMMARY OF THE INVENTION

In a first aspect of the invention, there is provided an illumination device including one or more light sources; directing means for directing the light emitted from at least one light source along a path to a region to be illuminated, characterized in that the light is diffused by the directing means as it moves along the path.

Thus, the light at the end of the path, i.e. that which illuminates the region, is more diffuse than the light entering the directing means at the start of the path.

Typically, the one or more light sources are located remotely from the region to be illuminated.

In one embodiment, the illumination device is suitable for use in a touch-sensitive display panel.

In one embodiment, the illumination device is mounted on the rear of a printed circuit board (PCB).

In one embodiment, the printed circuit board forms part of a display panel. Typically, the region to be illuminated forms part of the front of the display panel. Typically, the region is touch sensitive, i.e. the user operates the display panel by touching the appropriate region.

In one embodiment the region includes a legend. Typically, the legend contrasts with the rest of the region and represents a mode or provides information. Typically, the legend is provided as part of a touch-sensitive area or button.

In one embodiment, the directing means transmits light from the light source on the rear of the PCB, through an aperture in the PCB, to the rear surface of the legend in the display panel to illuminate the same. Typically, the legend is visible to a user when illuminated in this way.

In one embodiment, the light source is a standard, low-cost surface mount (SMT) LED which may be mounted at right angles to the PCB, for example, where space is restricted.

Thus, only one LED is needed to illuminate the whole legend, and there are no bright spots due to the diffusion effect. The diffusion effect thus substantially prevents uneven illumination of the legend.

Should a greater intensity be required, two or more light sources can be used and the diffusion effect used to mix the light together with no dim or bright spots. This can also be used to mix different colors together to achieve other light colors.

In one embodiment, a plurality of illumination devices could be molded as one part to illuminate a number of legends.

In one embodiment, the illumination device is associable with a display panel in a broadcast data receiver.

The invention allows simple and more cost effective backlighting of legends in touch-sensitive applications, i.e. those applications that require the PCB to be in contact with the fascia material that is being backlit. It is an advantage that using fewer LEDs to illuminate larger legends will lower the failure rate of display panels by reducing the component count. In addition, the invention can be used in minimal space applications, as the directing means on the reverse of the PCB can be small and yet provides good light diffusion, and may simplify construction of the PCB into the equipment.

Fascia and equipment design may be aided, as the lighting on the rear of the PCB is separated from the buttons and other mechanics in front of the PCB. In addition, servicing of more complicated panels may be easier, as the LEDs are on the reverse of the PCB, so that when the fascia assembly is removed from the equipment the reverse of the PCB is visible, so it may not need removing from the fascia assembly to replace or service the LEDs.

In a further embodiment of the invention, there is provided a display panel including one or more light sources; directing means for directing the light emitted from at least one light source along a path to a region of the display panel to be illuminated. The light is diffused by the directing means as it moves along the path.

In one embodiment the display panel is touch-sensitive.

In a further aspect of the invention, there is provided a broadcast data receiver comprising a display panel. The display panel is provided with the illumination device as described herein.

In a further aspect of the invention, there is provided electrical apparatus including a display panel. The display panel is provided with a printed circuit board and a fascia. The fascia is provided with one or more touch-sensitive portions; one or more legends associated with the touch-sensitive portions; one or more openings in the printed circuit board corresponding to the legends and/or touch sensitive portions; one or more light sources mounted on the rear of the printed circuit board. The directing means are provided to direct the light from at least one light source to at least one legend via an opening in the printed circuit board and diffuse the light to illuminate the legend substantially evenly.

In one embodiment the electrical apparatus is a broadcast data receiver.

BRIEF DESCRIPTION OF THE DRAWINGS

Specific embodiments of the invention are now described.

DETAILED DESCRIPTION OF THE INVENTION

Figure 1:
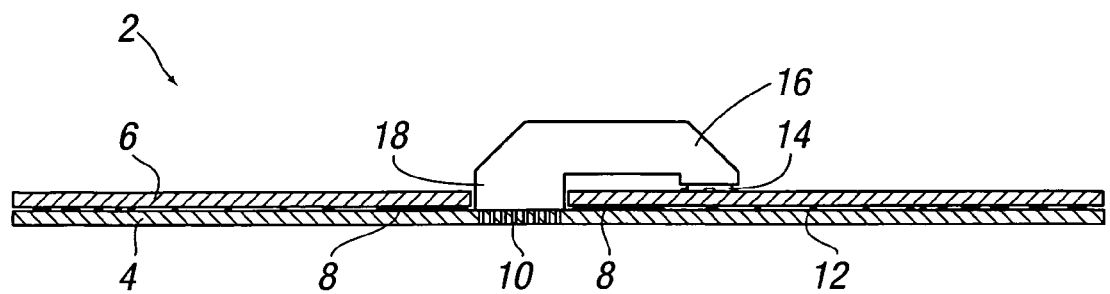
FIG. 1 illustrates a schematic side view of an illumination device in a display panel according to one embodiment of the invention.

FIG. 1 illustrates a display panel 2 fitted with an illumination device according to one embodiment of the invention. The display panel includes a plastic front panel fascia 4 on which is mounted a printed circuit board 6. The printed circuit board 6 is provided with copper tracking 12 and a region in the form of a touch-sensitive button 8 in the form of an oval or circle with an aperture 18 in the middle. The front panel 4 is provided with a legend 10 therein which corresponds with aperture 18 in printed circuit board 6.

On the rear of printed circuit board 6 there is provided a standard LED 14, and directing means in the form of a light pipe 16 is provided to direct the light from the LED to legend 10 via aperture 18 in printed circuit board 6. The light pipe 16 reflects and diffuses the light along the path defined thereby, such that only one LED 14 is needed to illuminate the whole legend 10, and there are no bright spots. As such, the number of components required is reduced and, advantageously, the invention can be used for applications where space is restricted, as the LEDs do not take up as much space or protrude as much as conventionally fitted LEDs.

Figure 2:
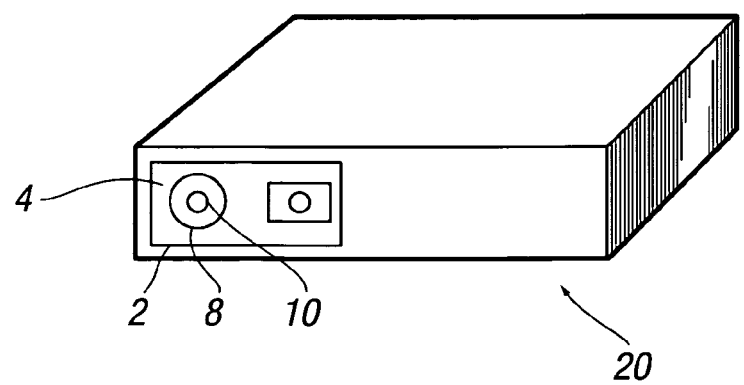
FIG. 2 illustrates a perspective view of an illumination device fitted to the display panel of a broadcast data receiver.

With reference to FIG. 2, there is illustrated an embodiment of the invention fitted to a broadcast data receiver 20, where the display panel 2 is provided with two touch-sensitive buttons 8, each provided with an illuminated legend 10 as hereinbefore described.

Thus, the invention improves the illumination of display panels and provides a means for reducing the number of components in touch-sensitive applications, thereby simplifying manufacture thereof. It will be appreciated by persons skilled in the art that the present invention may also include further additional modifications made to the device which does not affect the overall functioning of the device.

The invention claimed is:

1. An illumination device, mounted on a rear side of a printed circuit board said device comprising:
   at least one light source (14);
   directing means (16) for directing light emitted from at least one light source (14) along a path to a regions (10) to be illuminated;
   said light being directed from said rear side, through an aperture in the printed circuit board, to the other side of the printed circuit board, said aperture being surrounded by one or more regions comprising touch sensitive button or switches; and
   wherein the light is diffused by the directing means (16) as it moves along the path.

2. The illumination device according to claim 1 wherein said at least one light source is located remotely from said region to be illuminated.

3. The illumination device according to claim 1 wherein said printed circuit board forms part of a display panel.

4. The illumination device according to claim 3 wherein the regions to be illuminated forms part of a front of said display panel.

5. The illumination device according to claim 4 wherein said region includes a legend representing a mode or providing information.

6. The illumination device according to claim 5 wherein said directing means transmits light to a rear surface of said legend in said display panel to illuminate the display panel.

7. The illumination device according to claim 6 wherein said directing means diffuses the light to substantially prevent said legend from being illuminated unevenly.

8. The illumination device according to claim 1 wherein said region is touch sensitive.

9. The illumination device according to claim 1 wherein light from said at least one light source having one color can be mixed evenly together with a different color of said at least one light source via the directing means to achieve other light colors.

10. A broadcast data receiver (20), said receiver comprising:
    a display panel (2) having a printed circuit board:
    an illumination device mounted on a rear side of said printed circuit board, said illumination device further including
       at least one light source (14),
       directing means (16) for directing light emitted from at least one light source (14) along a path to a region (10) to be illuminated;
    said region forming part of a front of said display panel has one or more touch-sensitive button or switching portions;
    said light being directed from said rear side of the printed circuit board, through an aperture in the printed circuit board, to a rear surface of said region in said display panel; and
    and wherein the light is diffused by the directing means (16) as it moves along the path.

11. Electrical apparatus, said apparatus comprising:
    a display panel (2);
    a printed circuit board (6) and a fascia (4) being provided on said display panel;
    one or more touch-sensitive button or switching portions (8) provided with said fascia;
    one or more legends (10) associated with the touch-sensitive button or switching portions;
    one or more openings (18) in the printed circuit board corresponding to the one or more legends and/or touch-sensitive button or switching portions;
    one or more light sources (14) mounted on a rear of the printed circuit board; and
    wherein directing means (16) being provided to direct the light from at least one light source to at least one legend via an opening in the printed circuit board and to diffuse the light to illuminate the legend substantially evenly.

* * * * *